United States Patent
Yu et al.

(10) Patent No.: US 11,956,946 B2
(45) Date of Patent: Apr. 9, 2024

(54) METHOD FOR FORMING A SEMICONDUCTOR MEMORY STRUCTURE

(71) Applicant: ChangXin Memory Technologies, Inc., Hefei (CN)

(72) Inventors: Yexiao Yu, Hefei (CN); Zhongming Liu, Hefei (CN); Longyang Chen, Hefei (CN); Jia Fang, Hefei (CN)

(73) Assignee: ChangXin Memory Technologies, Inc., Hefei (CN)

( * ) Notice: Subject to any disclaimer, the term of this patent is extended or adjusted under 35 U.S.C. 154(b) by 0 days.

(21) Appl. No.: 17/745,257

(22) Filed: May 16, 2022

(65) Prior Publication Data

US 2022/0392903 A1 Dec. 8, 2022

(30) Foreign Application Priority Data

Jun. 2, 2021 (CN) .......................... 202110613570.8

(51) Int. Cl.
| | |
|---|---|
| *H01L 21/76* | (2006.01) |
| *H01L 23/528* | (2006.01) |
| *H01L 23/532* | (2006.01) |
| *H10B 12/00* | (2023.01) |
| *G11C 5/06* | (2006.01) |

(52) U.S. Cl.
CPC ....... *H10B 12/482* (2023.02); *H01L 23/5283* (2013.01); *H01L 23/53295* (2013.01); *H10B 12/485* (2023.02); *G11C 5/063* (2013.01)

(58) Field of Classification Search
CPC . H10B 12/482; H10B 12/485; H01L 23/5283; H01L 23/53295; H01L 21/76805; H01L 21/76877; H01L 21/76895; H01L 23/481; G11C 5/063
See application file for complete search history.

(56) References Cited

U.S. PATENT DOCUMENTS

| | | | |
|---|---|---|---|
| 2012/0074518 A1* | 3/2012 | Kim | .................... H01L 29/4236 257/E27.013 |
| 2014/0127903 A1* | 5/2014 | Kim | .................... H01L 21/7685 438/653 |
| 2018/0190586 A1* | 7/2018 | Chang | .................. H10B 12/485 |
| 2018/0240705 A1* | 8/2018 | Chang | ............... H01L 21/76224 |

FOREIGN PATENT DOCUMENTS

CN 108878442 B 1/2021

* cited by examiner

*Primary Examiner* — Shouxiang Hu
(74) *Attorney, Agent, or Firm* — Alston & Bird LLP

(57) ABSTRACT

The semiconductor structure manufacturing method includes the steps of: providing a substrate with bit line contact regions and isolation regions located between adjacent bit line contact regions; forming a groove in the substrate, the bottom of the groove exposes the bit line contact region and the isolation region adjacent to the bit line contact region; forming a contact region isolation layer covering at least sidewalls of the groove; and forming a contact region to cover the contact region isolating the surface of the layer and filling the bit line contact layer of the groove, the bit line contact layer being in contact with the bit line contact region at the bottom of the groove; forming a bit line layer on the bit line contact layer. The invention avoids damage to the sidewalls of the active region in the substrate.

13 Claims, 21 Drawing Sheets

METHOD FOR FORMING A SEMICONDUCTOR MEMORY STRUCTURE

TECHNICAL FIELD

The present invention relates to the technical field of semiconductor manufacturing, and in particular, to a semiconductor structure and a method for forming the structure.

BACKGROUND

The development of semiconductor structures such as dynamic random access memory (DRAM) pursues high speed, high integration, and low power consumption. With the shrinking of semiconductor structure sizes, especially in the manufacturing process of dynamic random access memory at critical dimensions less than 17 nm, the morphology of the bit line contact layer formed in the bit line contact hole determines the resistance value and current intensity of the bit line. Defects in the bit line contact layer in the bit line contact hole will bring serious leakage problems to the bit line structure. However, the current semiconductor structure process has the following problems: the process of forming the bit line structure is complicated and at high cost; it is prone to causing damage to the sidewalls of the active region during the process of forming the bit line structure. Due to the shrinking of the sizes, it is likely to cause short circuits between the contact layer of the bit line and the capacitance contact layer.

Therefore, how to optimize the manufacturing process of the semiconductor structure, improve the electrical properties of the semiconductor structure, and improve the yield of the semiconductor structure has become an urgent problem to be solved at the present time.

SUMMARY

The disclosure provides a semiconductor structure and a method for forming it, to solve the problem of complex manufacturing process of the existing semiconductor structure, improve the electrical properties of the semiconductor structure, and improve the yield of the semiconductor structure.

The present invention provides a method for forming a semiconductor structure, comprising the following steps:

providing a substrate having a plurality of bit line contact regions and isolation regions between adjacent bit line contact regions;

forming a groove in the substrate, and the bottom of the groove exposes the bit line contact region and the isolation region adjacent to the bit line contact region;

forming a contact area isolation layer covering at least the sidewalls of the groove;

forming a bit line contact layer covering the surface of the contact area isolation layer and filling the groove, the bit line contact layer being in contact with the bit line contact area at the bottom of the groove; and forming a bit line layer on the bit line contact layer.

In order to solve the above problems, the present invention also provides a semiconductor structure, comprising:

a substrate having a plurality of bit line contact regions and isolation regions between adjacent bit line contact regions;

a groove, located in the substrate, the bottom of the groove exposes the bit line contact regions and the isolation regions adjacent to the bit line contact regions;

a contact area isolation layer covering the sidewalls of the groove;

a bit line contact layer, covering the surface of the contact area isolation layer and filling the groove, the bit line contact layer is in contact with the bit line contact area at the bottom of the groove, and the top surface of the bit line contact layer is flush with the top surface of the substrate, or the top surface of the bit line contact layer is lower than the top surface of the substrate; and the bit line layer is located on the bit line contact layer.

BRIEF DESCRIPTION OF THE DRAWINGS

By describing its exemplary embodiments in detail with reference to the accompanying drawings, the above and other objectives, features and advantages of the present disclosure will become more apparent.

DETAILED DESCRIPTION OF THE PREFERRED EMBODIMENTS

The specific embodiments of the semiconductor structure and the method forming it provided by the present invention will be described in detail below with reference to the accompanying drawings.

Figure 1:
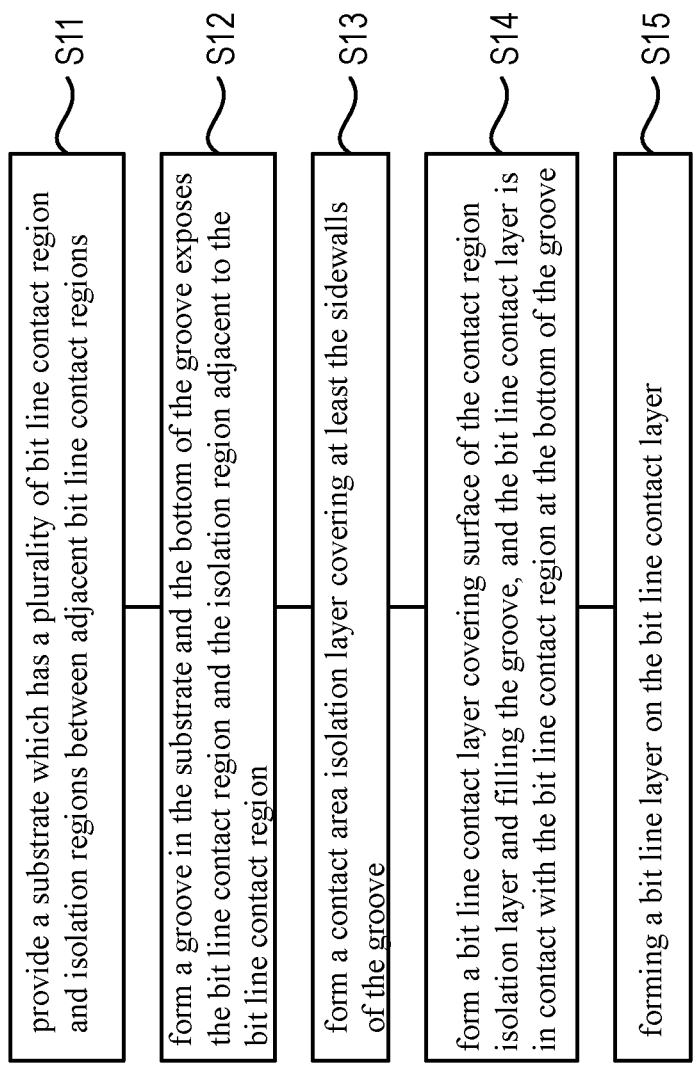
FIG. 1 is a flowchart of a method for forming a semiconductor structure according to a specific embodiment of the present invention.
Figure 2A:
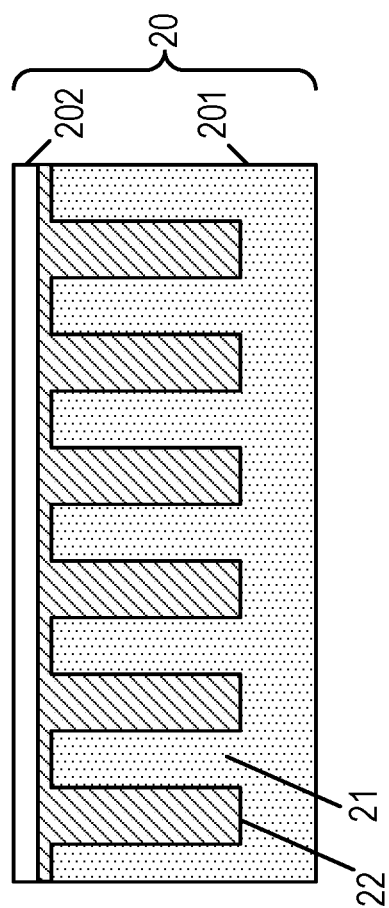
FIGS. 2A-2S are schematic diagrams of the main processes in the process of forming the semiconductor structure according to the specific embodiment of the present invention.
Figure 2B:
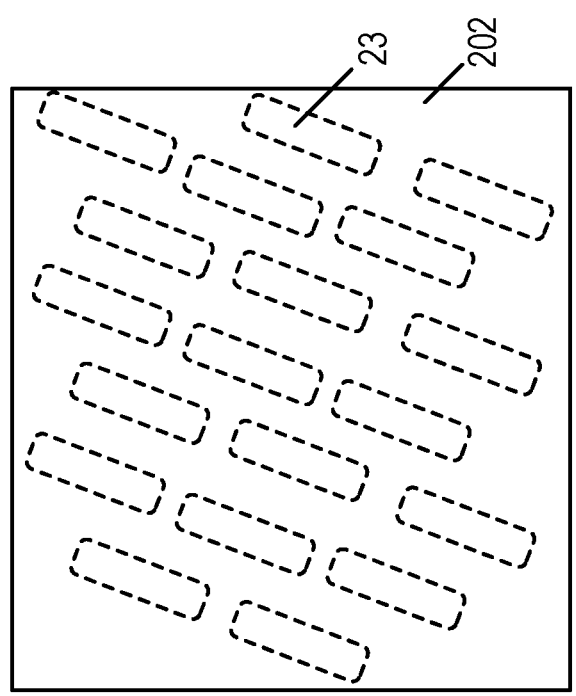
Figure 2C:
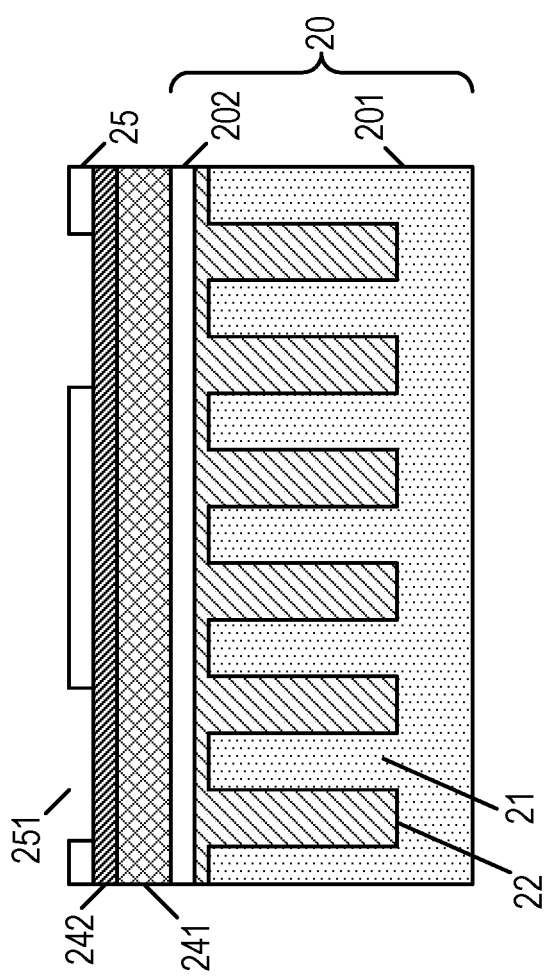
Figure 2D:
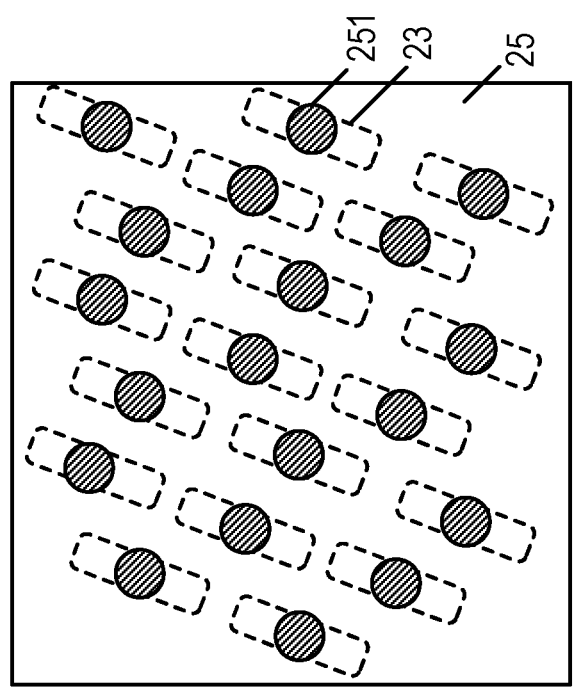
Figure 2E:
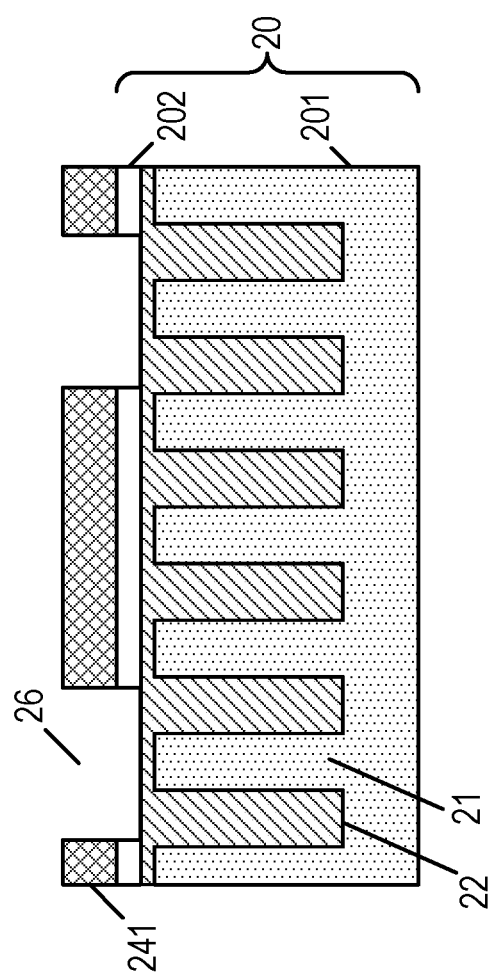

This embodiment provides a method for forming a semiconductor structure. FIG. 1 is a flowchart of the method for forming a semiconductor structure according to the embodiment of the present invention. FIGS. 2A-2S illustrate the schematic diagrams of the steps in the process of forming the semiconductor structure according to the embodiment of the present invention. As shown in FIG. 1 and FIG. 2A-FIG. 2S, the method for forming a semiconductor structure provided by this embodiment includes the following steps:

In step S11, a substrate 20 is provided, and the substrate 20 has a plurality of bit line contact regions 21 and isolation regions 22 between adjacent bit line contact regions 21, as shown in FIG. 2A.

Specifically, the substrate 20 includes a substrate base 201 and a substrate isolation layer 202 located on the surface of the substrate 201. The substrate base 201 has a plurality of active regions 23 arranged in an array, as shown in FIG. 2B. FIG. 2B is a schematic top view of the cross sectional structure of FIG. 2A, the active regions 23 are not visible under the viewing angle shown in FIG. 2B, so they are represented by a dotted line in FIG. 2B. Each of the active regions 23 has a bit line contact region 21 and a capacitor contact region (not shown in the figure) located outside the bit line contact region 21. In directions parallel to the surface of the substrate 201, the bit line contact regions 21 in the adjacent active regions 23 are also isolated from each other by the isolation regions 22. The material of the isolation regions 22 may be, but not limited to, an oxide material, such as silicon dioxide.

Figure 2F:
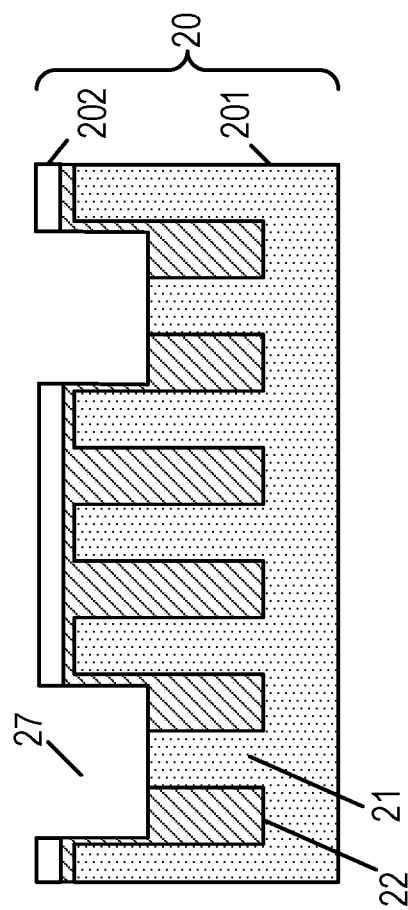
Figure 2G:
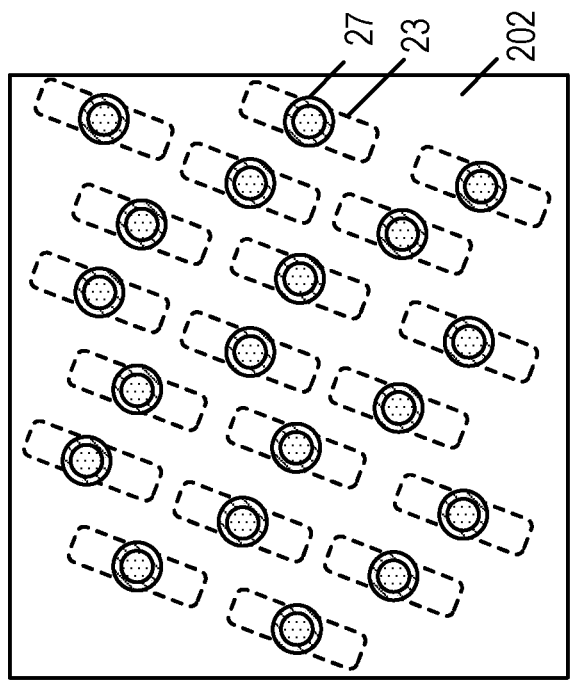

In step S12, a groove 27 is formed in the substrate 20, and the bottom of the groove 27 exposes the bit line contact region 21 and the isolation region 22 adjacent to the bit line contact region 21, as shown in FIG. 2F and FIG. 2G. FIG. 2G is a schematic top view of the structure of FIG. 2F.

Optionally, the substrate 20 includes a substrate 201 and a substrate isolation layer 202 located on the surface of the substrate 201; the specific steps of forming the groove 27 in the substrate 20 include:

forming a first mask layer 241 covering the surface of the substrate isolation layer 202, the first mask layer 241 has a first etching window 26 exposing the substrate isolation layer 202;

etching the substrate isolation layer 202 and the substrate base 201 along the first etching window 26 to form the groove 27.

Specifically, first, polysilicon material is deposited on the surface of the substrate isolation layer 202 to form the first mask layer 241. In order to ensure the morphology of the first etching window 26, SION material may also be deposited on the surface of the first mask layer 241, to form a third mask layer 242 subsequently. After that, a patterned first photoresist layer 25 is formed on the surface of the third mask layer 242, and the first photoresist layer 25 has a first opening 251 exposing the third mask layer 242, as shown in FIG. 2C and FIG. 2D. FIG. 2D is a schematic top view of the structure of FIG. 2C. Next, the third mask layer 242 and the first mask layer 241 are etched downward along the first opening 251 as shown in FIG. 2E, and form an edge perpendicular to the substrate 201 through the first etching window 26 of the first mask layer 241. Then, the substrate isolation layer 202 is etched along the first etching window 26, the substrate 201 is exposed, and the first photoresist 25 and the third mask layer 242 are removed, as shown in FIG. 2E. After that, continue to etch the substrate 201 along the first etching window 26 to remove part of the bit line contact region 21 and part of the isolation region 22 adjacent to the bit line contact region 21, form the grooves 27 in the substrate 201, and after the first mask layer 241 is removed, the structure obtained is shown in FIG. 2F and FIG. 2G.

Optionally, the bottom of the groove 27 exposes the bit line contact region 21 and the isolation regions 22 located on opposite side of the bit line contact region 21 and adjacent to the bit line contact region 21.

Specifically, the entire bit line contact region 21 and the bit line contact region 21 adjacent to the bit line contact region 21 and located on opposite side of the bit line contact region 21 are exposed simultaneously through the bottom of the groove 27. The isolation region 22, on the one hand, reserves space for the subsequent formation of the contact region isolation layer, on the other hand does not affect the contact area between the subsequently formed bit line contact layer and the bit line contact region 21, thereby ensuring good electrical performance of the semiconductor structure.

In this embodiment, as an example, what is illustrated is that the bottom of the groove 27 exposes the bit line contact region 21 and the isolation regions located on opposite sides of the bit line contact region 21 and the adjacent layer 22 to the bit line contact region. Those skilled in the art can also adjust the pattern in the first photoresist layer 25 according to actual needs, so that the bottom of the groove 27 exposes the bit line contact region 21 and is only located in the bit line contact region 21 of the isolation region 22 adjacent to the bit line contact region 21.

Optionally, in a direction parallel to the substrate 20, the groove 27 does not penetrate the isolation region 22.

Specifically, the fact that the groove 27 does not penetrate the isolation region 22 means that the sidewalls of the groove 27 still have the material of the isolation region 22 remaining, so as to avoid contacting the adjacent bit line contact regions 21, the adjacent active regions 23 and/or adjacent capacitive contact regions to cause damage.

Figure 2H:
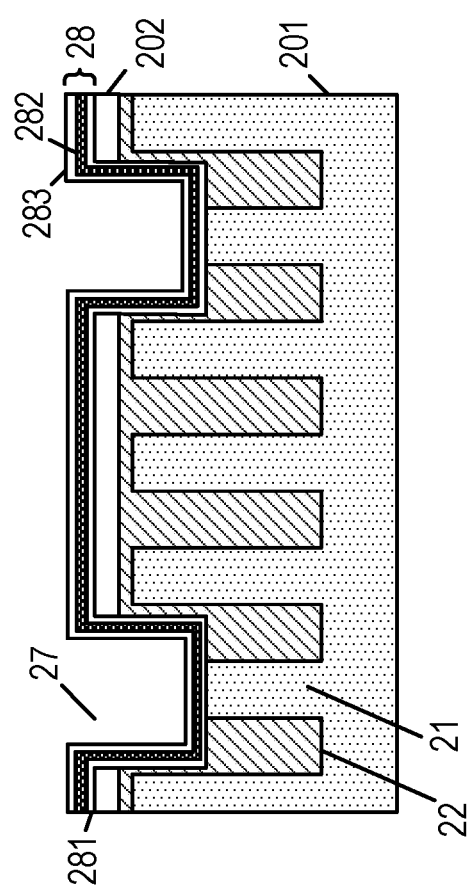
Figure 21:
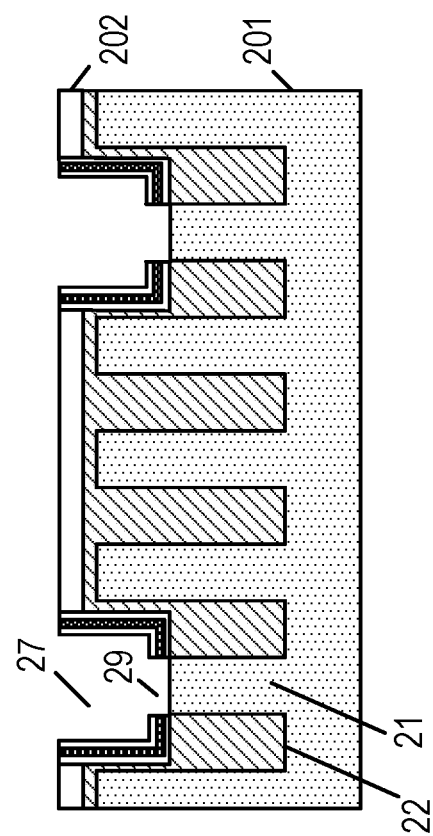
Figure 2J:
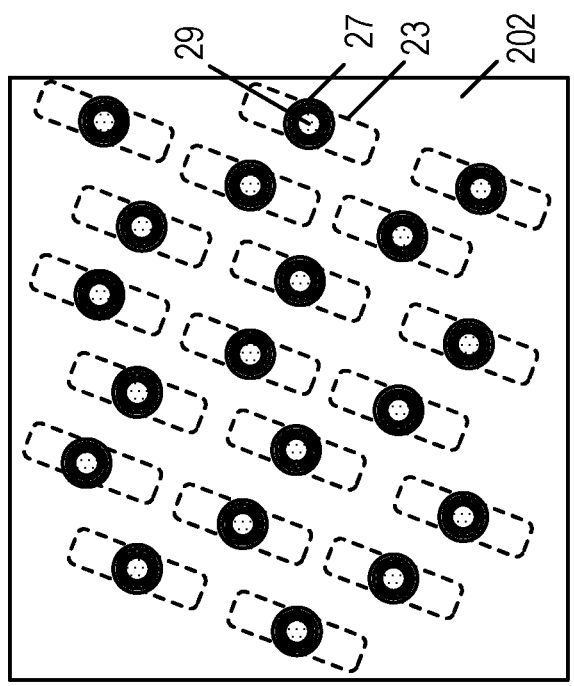
Figure 2K:
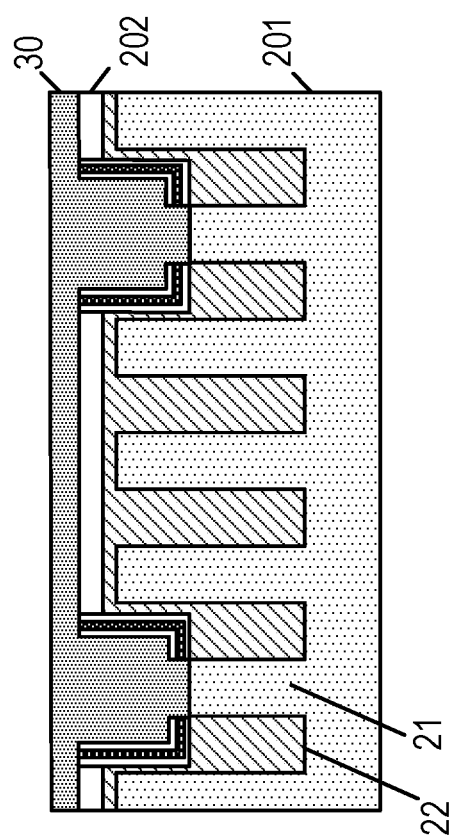
Figure 2L:
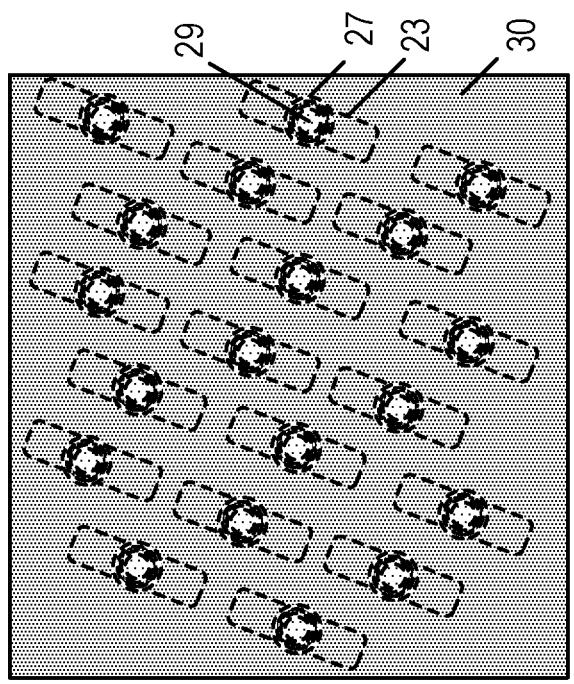

Step S13, forming a contact area isolation layer 28 covering at least the sidewalls of the groove 27, as shown in FIG. 2H, FIG. 2I and FIG. 2J, whereas FIG. 2J is a schematic top view of FIG. 2I.

Optionally, the specific steps of forming the contact area isolation layer 28 covering the sidewalls of the groove 27 include:

Depositing an isolation material on the inner walls of the groove 27 and the surface of the substrate isolation layer 202 to form the contact area isolation layer 28;

The surface of the substrate isolation layer 202 and the contact area isolation layer 28 at the bottom of the groove 27 are removed.

Optionally, the contact area isolation layer 28 has a single-layer structure or a multi-layer structure.

Optionally, the specific steps of forming the contact region isolation layer 28 in FIG. 2H include:

depositing a first insulating material on the inner walls of the groove 27 and the surface of the substrate isolation layer 202 to form a first sub-contact region isolation layer 281;

depositing a second insulating material on the surface of the first sub-contact region isolation layer 281 to form a second sub-contact region isolation layer 282; and depositing a third insulating material on the surface of the second sub-contact region isolation layer 282 to form a third sub-contact region isolation layer 283.

For example, after the groove 27 is formed, the first sub-contact region isolation layer 281 is deposited on the inner walls of the groove 27 and the surface of the bottom contact layer 202, using a chemical vapor deposition process, a physical vapor deposition process or an atomic layer deposition process; then, the second sub-contact region isolation layer 282 is deposited on the surface of the first sub-contact region isolation layer 281; after that, the third sub-contact region isolation layer 283 is deposited on the second sub-contact region isolation layer 282, as shown in FIG. 2H. The contact area isolation layer 28 is composed of the first sub-contact area isolation layer 281, the second sub-contact area isolation layer 282 and the third sub-contact area isolation layer 283. After that, a dry etching process is used to remove the surface of the substrate isolation layer 202 and the contact area isolation layer 28 at the bottom of the groove 27, exposing the bit line contact area 21 from the bottom of the groove 27, and keeping only the sidewalls of the groove 27 and part of the contact area isolation layer 28 located at the bottom of the groove 27, as shown in FIG. 2I and FIG. 2J. The contact area isolation layer 28 can effectively prevent the leakage problem between the bit line contact area 21 and the capacitor contact area located inside the same active area 23.

In order to reduce the parasitic capacitance inside the semiconductor structure and at the same time ensure the electrical isolation effect of the contact region isolation layer 28, the material of the first sub-contact region isolation layer 281 may be the same material as that of the third sub-contact region isolation layer 283, the density of the first sub-contact area isolation layer 281 is greater than that of the second sub-contact area isolation layer 282, and the dielectric constant of the second sub-contact area isolation layer 282 is smaller than the dielectric constant of the isolation layer 281 in the first sub-contact region. Optionally, the first insulating material and the third insulating material are both nitride materials, and the second insulating material is an oxide material.

In order to reduce the contact resistance between the subsequently formed bit line contact layer and the bit line contact region 21, optionally, the projection of the contact region isolation layer 28 along the direction perpendicular to the substrate 201 is different from the bit line contact region 21. The line contact areas 21 do not overlap.

Figure 2M:
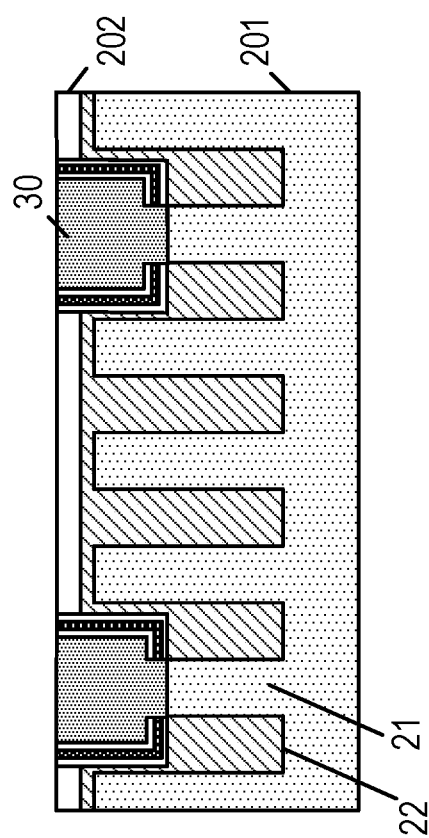
Figure 2N:
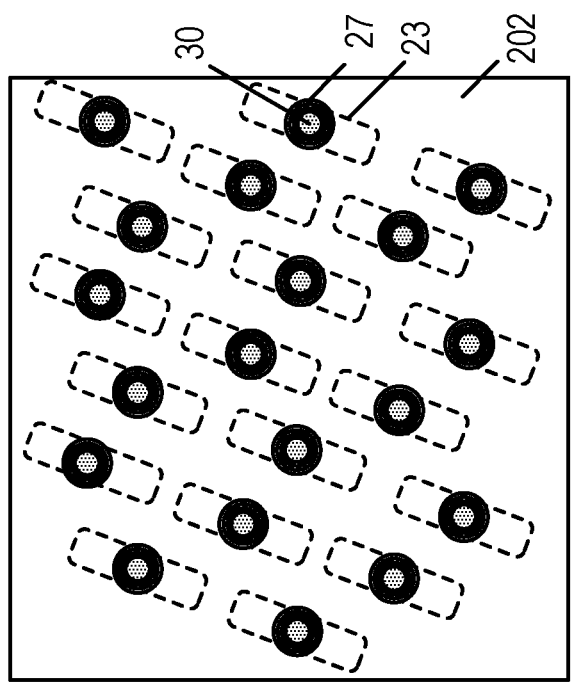
Figure 20:
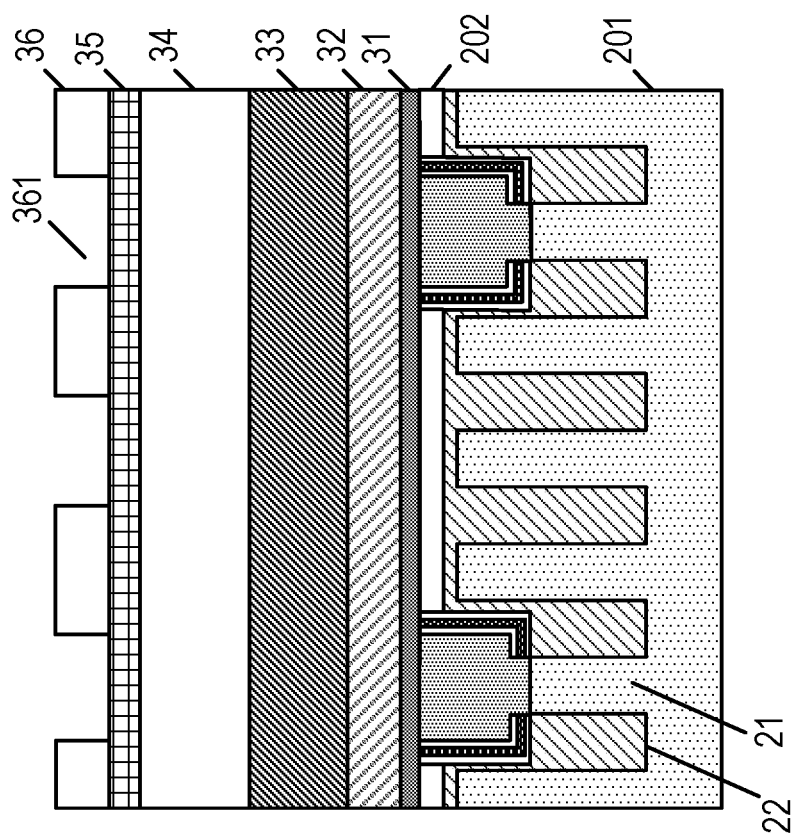
Figure 2P:
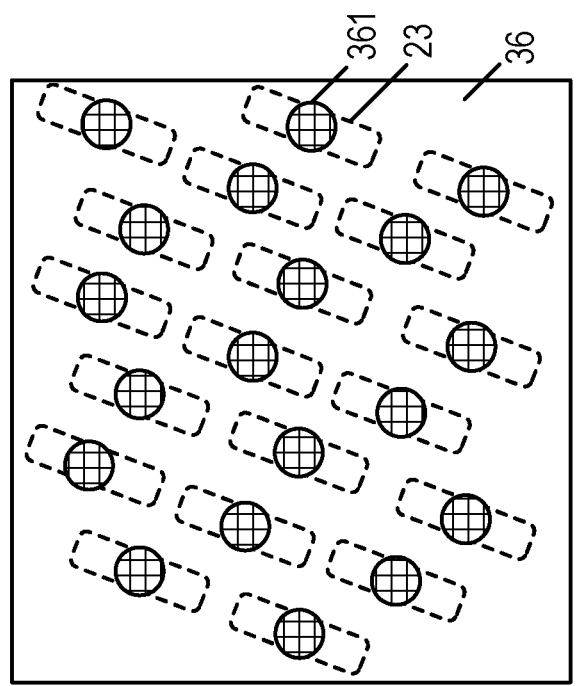

Step S14, forming a bit line contact layer 30 covering the surface of the contact region isolation layer 28 and filling the groove 27, and the bit line contact layer 30 is in contact with the bit line contact region 21 at the bottom of the groove 27 in FIG. 2M and FIG. 2N, whereas FIG. 2N is a schematic top view of the structure in FIG. 2M.

Optionally, the specific steps of forming the bit line contact layer 30 covering the surface of the contact region isolation layer 28 and filling the groove 27 include:

a first conductive material is deposited on the surface of the contact area isolation layer 28, the surface of the substrate isolation layer 202, and the first conductive material fills the groove 27 to form a bit line contact layer 30, as shown in FIG. 2K and FIG. 2L, whereas FIG. 2L is a schematic top view structure of the structure in FIG. 2K; and then the bit line contact layer 30 covering the surface of the substrate isolation layer 202 is removed.

Specifically, in the process of forming the bit line contact layer 30 through the filling process, since the formed contact area isolation layer 28 has a flat surface and a uniform material, it can not only improve the sidewalls shape of the bit line contact layer 30, it also helps to improve the filling effect of the bit line contact layer 30 and reduce the internal defects of the bit line contact layer 30. In this specific embodiment, a dry etching process or a chemical mechanical polishing process can be used to remove the bit line contact layer 30 covering the surface of the substrate isolation layer 202. The material of the bit line contact layer 30 may be, but not limited to, polysilicon material.

Optionally, the top surface of the bit line contact layer 30 is flush with the top surface of the substrate isolation layer 202. Alternatively, the top surface of the bit line contact layer 30 is lower than the bottom surface of the substrate isolation layer 202.

In this embodiment, before the bit line layer is formed, the bit line contact layer 30 is first formed inside the substrate 20, and the contact area isolations are pre-formed on opposite sides of the bit line contact layer 30 layer 28, so that damage to the bit line contact layer 30 can be effectively avoided in subsequent processes.

Figure 2Q:
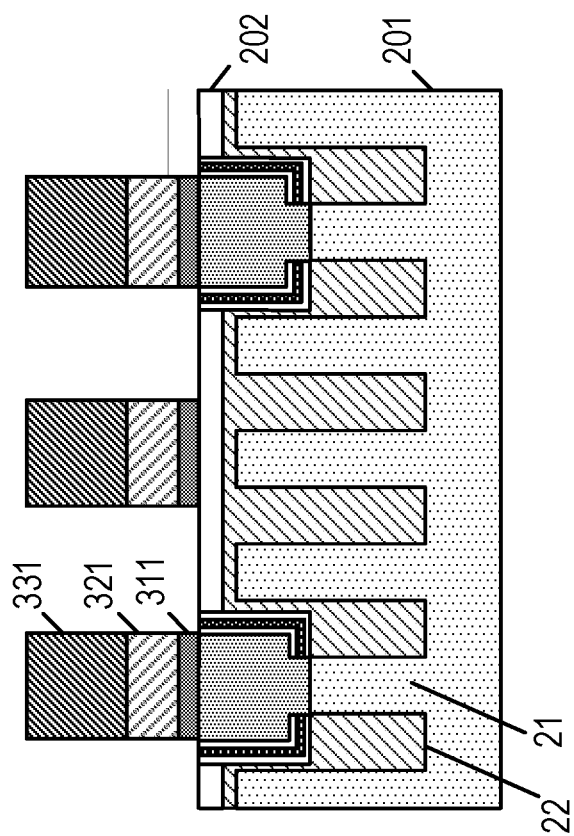
Figure 2R:
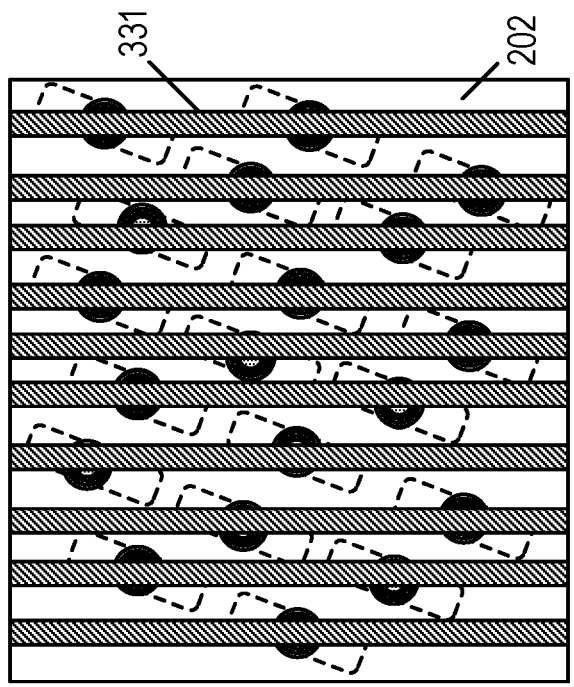
Figure 2S:
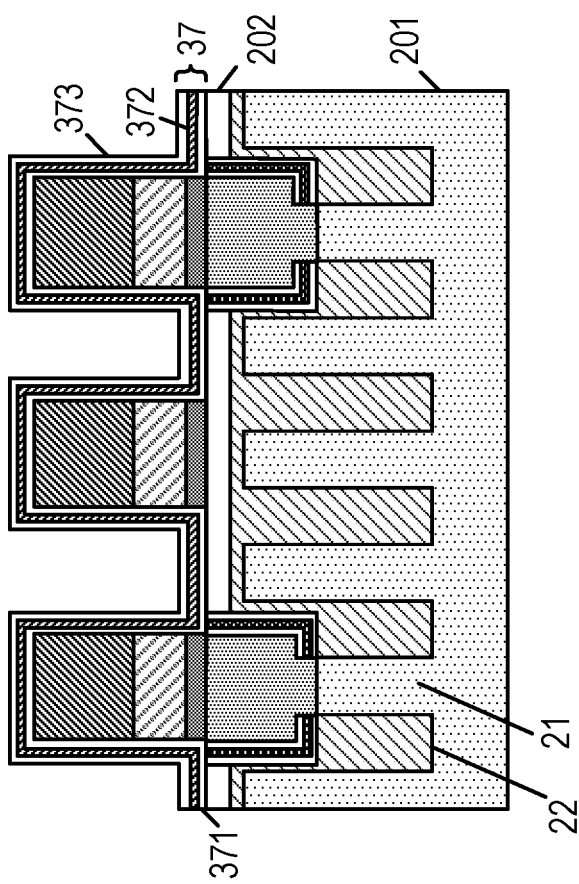

Step S15, forming a bit line layer 321 on the bit line contact layer 30, as shown in FIG. 2Q and FIG. 2R, wherein FIG. 2R is a schematic top view of FIG. 2Q.

Optionally, the steps of forming the bit line layer 321 on the bit line contact layer 30 include:

depositing a diffusion barrier material on the surface of the bit line contact layer 30 and the substrate isolation layer 202 to form an initial diffusion barrier layer 31 shown in FIG. 2O;

depositing a second conductive material on the surface of the initial diffusion barrier layer 31 to form the initial bit line layer 32;

depositing a cap layer material on the surface of the initial bit line layer 32 to form an initial bit line cap layer 33; and forming a second mask layer 34 on the initial bit line capping layer 33, wherein the second mask layer 34 has a second etching window for exposing the initial bit line capping layer 33.

As shown in FIG. 2Q, the initial bit line cap layer 33, the initial bit line layer 32 and the initial diffusion barrier layer 31 are etched along the second etching window to form a diffusion barrier layer 311 on the bit line contact layer 30, a bit line layer 321 located on the diffusion barrier layer 311, and a bit line cap layer 331 located on the bit line layer 321.

Specifically, the initial diffusion barrier layer 31, the initial bit line layer 32, the initial bit line cap layer 33, the second mask layer 34, the initial bit line cap layer 33, the second mask layer 34, the fourth mask layer 35 and the patterned second photoresist layer 36 are formed. The second photoresist layer 36 has a second opening 361 exposing the fourth mask layer 35, as shown in FIG. 2O and FIG. 2P, wherein FIG. 2P is a schematic top view of the structure of FIG. 2O. The fourth mask layer 35, the second mask layer 34, the initial bit line capping layer 33, the initial bit line layer 32 and the initial diffusion are etched downward along the second opening 361. The barrier layer 31, the initial diffusion barrier layer remaining on the bit line contact layer 30, is used as the diffusion barrier layer 311, the initial bit line layer remaining on the diffusion barrier layer 311 is used as the bit line layer 321, The initial bit line capping layer on the bit line layer 321 is used as the bit line capping layer 331, after removing the second mask layer 34, the fourth mask layer 35 and the second photoresist layer 36 are the structures obtained, shown in FIG. 2Q and FIG. 2R. The bit line contact layer 30, the diffusion barrier layer 311, the bit line layer 321 and the bit line cap layer 331 together constitute a bit line structure. In this specific embodiment, since the bit line contact layer 30 is formed in advance, in the process of etching and forming the bit line layer 321, the substrate isolation layer 202 is used as an etching stop layer, and there is no need to etch to the inside of the substrate 201. Thus, the manufacturing steps of the semiconductor structure are greatly simplified, and the manufacturing risk is reduced.

Optionally, after forming the diffusion barrier layer 311 on the bit line contact layer 30, forming the bit line layer 321 on the diffusion barrier layer 311, and forming the bit line capping layer 331 on the bit line layer 321, the process further includes the following steps:

forming a bit line isolation layer 37 covering the sidewalls of the diffusion barrier layer 311, the sidewalls of the bit line layer 321, the sidewalls and the top surface of the bit line capping layer 331, and the surface of the substrate isolation layer 202, as shown in FIG. 2S.

Optionally, the bit line isolation layer 37 is made of the same material as the contact region isolation layer 28.

Optionally, the steps of forming a bit line isolation covering the sidewalls of the diffusion barrier layer 311, the sidewalls of the bit line layer 321, the sidewalls and top surface of the bit line cap layer 331, and the bit line isolation layer 37 on the surface of the substrate isolation layer 202, include:

depositing a first dielectric material on the sidewalls of the diffusion barrier layer 311, the sidewalls of the bit line layer 321, the sidewalls and the top surface of the bit line capping layer 331, and the surface of the substrate isolation layer 202 to form a first sub-bit line isolation layer 371;

depositing a second dielectric material on the surface of the first sub-bit line isolation layer 371 to form a second sub-bit line isolation layer 372; and depositing a third dielectric material on the surface of the second sub-bit line isolation layer 372 to form a third sub-bit line isolation layer 373.

In order to reduce the parasitic capacitance inside the semiconductor structure and at the same time ensure the electrical isolation effect of the bit line isolation layer 37, the material of the first sub-bit line isolation layer 371 may be the same as that of the third sub-bit line isolation layer, the density of the first sub-bit line isolation layer 371 is greater than that of the second sub-bit line isolation layer 372, and the dielectric constant of the second sub-bit line isolation layer 372 is smaller than the dielectric constant of the first sub-bit line isolation layer 371. Optionally, both the first dielectric material and the third dielectric material are nitride materials (e.g., silicon nitride), and the second dielectric material is an oxide material (e.g., silicon dioxide).

Figure 3:
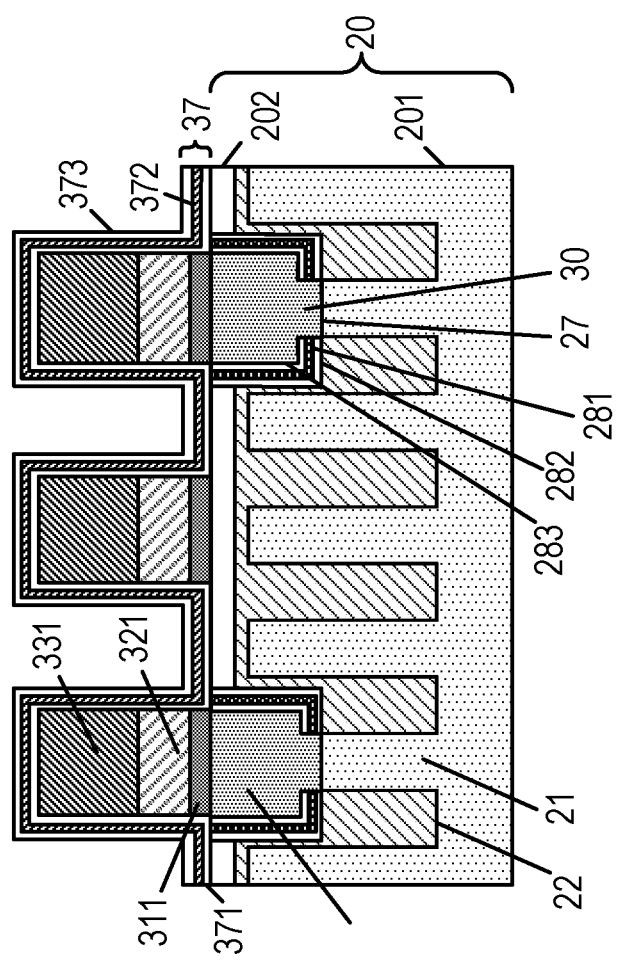
FIG. 3 is a schematic diagram of a semiconductor structure provided by another embodiment of the present invention.

In addition, this specific embodiment also provides a semiconductor structure, and FIG. 3 is a schematic diagram of the semiconductor structure provided by another embodiment of the present invention. The semiconductor structure provided by this specific embodiment can be formed by using the method for forming the semiconductor structure shown in FIG. 1 and FIG. 2A-FIG. 2S. As shown in FIGS. 2A-2S and FIG. 3, the semiconductor structure includes:

a substrate 20 having a plurality of bit line contact regions 21 and isolation regions 22 between adjacent bit line contact regions 21;

a groove 27, located in the substrate 20, the bottom of the groove 27 exposes the bit line contact region 21 and the isolation region 22 adjacent to the bit line contact region 21;

the contact area isolation layer 28 covers the sidewalls of the groove 27;

the bit line contact layer 30 covers the surface of the contact area isolation layer 28 and fills the groove 27, the bit line contact layer 30 is in contact with the bit line contact area 21 at the bottom of the groove 27, and the top surface of the bit line contact layer 30 is flush with the top surface of the substrate 20 or the top surface of the bit line contact layer 30 is lower than the top surface of the substrate 20; and the bit line layer 321 is located on the bit line contact layer 30.

Optionally, the base 20 includes a substrate 201 and a substrate isolation layer 202 located on the surface of the substrate 201; and the top surface of the bit line contact layer 30 is flush with the top surface of the substrate isolation layer 202.

Optionally, the bottom of the groove 27 exposes the bit line contact region 21 and the isolation regions 22 located on opposite sides of the bit line contact region 21 and adjacent to the bit line contact region 21.

Optionally, in a direction parallel to the substrate 20, the groove 27 does not penetrate the isolation region 22.

Optionally, the contact area isolation layer 28 has a single-layer structure or a multi-layer structure.

Optionally, the contact area isolation layer 28 includes:

the first sub-contact region isolation layer 281 covers the sidewalls of the groove 27;

the second sub-contact region isolation layer 282 covers the surface of the first sub-contact region isolation layer 281; and the third sub-contact region isolation layer 283 covers the surface of the second sub-contact region isolation layer 282.

Optionally, the semiconductor structure further includes:

the diffusion barrier layer 311 is located between the bit line contact layer 30 and the bit line layer 321;

the bit line capping layer 331 is located on the bit line layer 321;

the bit line isolation layer 37 covers the sidewalls of the diffusion barrier layer 311, the sidewalls of the bit line layer 321, the sidewalls and the top surface of the bit line capping layer 331, and the surface of the substrate isolation layer 202.

Optionally, the bit line isolation layer 37 is made of the same material as the contact region isolation layer 28.

Optionally, the bit line isolation layer 37 includes:

the first sub-bit line isolation layer 371 covers the sidewalls of the diffusion barrier layer 311, the sidewalls of the bit line layer 321, the sidewalls and the top surface of the bit line capping layer 331, and the substrate isolation layer 202 surface;

the second sub-bit line isolation layer 372 covers the surface of the first sub-bit line isolation layer 371; and the third sub-bit line isolation layer 373 covers the surface of the second sub-bit line isolation layer 372.

In the semiconductor structure and the method for forming the same provided by this specific embodiment, the lining substrate is etched before the bit line layer is formed on the substrate to form the bottom exposed bit line contact region and the isolation adjacent to the bit line contact region. The size of the groove can be precisely controlled to avoid damage to the sidewalls of the active area in the substrate. Moreover, the bit line contact layer is formed in the groove through a filling process, which can ensure the integrity of the sidewalls morphology of the bit line contact layer, and also avoid damage to the bit line contact layer caused by subsequent processes, thereby effectively avoiding or reducing the problem of bit line leakage. In addition, by forming the contact area isolation layer on the sidewalls of the groove, the short circuit between the bit line contact layer and the capacitor contact layer can be prevented.

The above only discloses the preferred embodiments of the present invention. It should be pointed out that for those skilled in the art, without departing from the principles of the present invention, several improvements and modifications can also be made, and these improvements and modifications should also be regarded as It is the protection scope of the present invention.

The exemplary embodiments of the present disclosure are specifically shown and described above. It should be understood that the present disclosure is not limited to the detailed structure, arrangement or implementation method described herein; on the contrary, the present disclosure intends to cover various modifications and equivalent arrangements included in the spirit and scope of the appended claims.

The invention claimed is:

1. A method of formation a semiconductor structure, comprising steps of:
providing a substrate, wherein a substrate isolation layer is disposed on a top surface of the substrate, wherein the substrate comprises bit line contact regions and isolation regions, wherein each of the isolation regions is located between adjacent two of the bit line contact regions;
forming a stack of layers on the substrate isolation layer;
forming a first etching window on the stack of layers, and etching the stack of layers and the substrate isolation layer along the first etching window;
removing the stack of layers from a top surface of the substrate isolation layer outside the first etching window;
forming a groove along the first etching window in the substrate, wherein a bottom of the groove exposes one of the bit line contact regions and two of the isolation regions adjacent to said one of the bit line contact regions;
forming a contact region isolation layer covering sidewalls of the groove;
forming a bit line contact layer covering a surface of the contact region isolation layer and filling the groove, wherein the bit line contact layer is arranged to be in contact with said one of the bit line contact regions at the bottom of the groove; and forming a bit line layer on the bit line contact layer.

2. The method of forming the semiconductor structure according to claim 1, wherein the two adjacent isolation regions are located at two opposite sides of said one of the bit line contact regions.

3. The method of forming the semiconductor structure according to claim 2, wherein the groove does not penetrate the isolation region in a direction parallel to the substrate.

4. The method of forming the semiconductor structure according to claim 1, wherein the step of forming the contact region isolation layer covering the sidewalls of the groove comprises:
depositing isolation material on inner walls of the groove and the top surface of the substrate isolation layer to form a contact region isolation layer; and
removing the contact region isolation layer from the top surface of the substrate isolation layer and the bottom of the groove.

5. The method of forming the semiconductor structure according to claim 4, wherein the contact region isolation layer is a single-layer structure or a multi-layer structure.

6. The method of forming the semiconductor structure according to claim 4, wherein the step of forming the contact region isolation layer comprises:
depositing a first insulating material on the inner walls of the groove and the top surface of the substrate isolation layer to form a first sub-contact region isolation layer;
depositing a second insulating material on a surface of the first sub-contact region isolation layer to form a second sub-contact region isolation layer; and
depositing a third insulating material on a surface of the second sub-contact region isolation layer to form a third sub-contact region isolation layer.

7. The method of forming the semiconductor structure according to claim 6, wherein the first insulating material and the third insulating material are both nitride material, and the second insulating material is an oxide material.

8. The method of forming the semiconductor structure according to claim 1, wherein the step of forming the bit line contact layer covering the surface of the contact region isolation layer and filling the groove comprises:
depositing a first conductive material on the surface of the contact region-isolation layer, the top surface of the substrate isolation layer, and into the groove to form the bit line contact layer; and
removing the bit line contact layer from the top surface of the substrate isolation layer.

9. The method of forming the semiconductor structure according to claim 1, wherein a top surface of the bit line contact layer is flush with the top surface of the substrate isolation layer.

10. The method of forming the semiconductor structure according to claim 1, wherein the step of forming the bit line layer on the bit line contact layer comprises:
depositing a diffusion barrier material on the surface of the bit line contact layer and the surface of the substrate isolation layer to form an initial diffusion barrier layer;
depositing a second conductive material on a surface of the initial diffusion barrier layer to form an initial bit line layer;
depositing a cap layer material on a surface of the initial bit line layer to form an initial bit line cap layer;
forming a second mask layer on the initial bit line cap layer, wherein the second mask layer comprises a second etching window for exposing the initial bit line cap layer; and
etching the initial bit line cap layer, the initial bit line layer, and the initial diffusion barrier layer along the second etching window to form a diffusion barrier layer on the bit line contact layer, a bit line layer on the diffusion barrier layer, and a bit line cap layer on the bit line layer.

11. The method of forming the semiconductor structure according to claim 10, wherein after forming the diffusion barrier layer on the bit line contact layer, the bit line layer on the diffusion barrier layer, the bit line layer on the bit line contact layer, and the bit line capping layer on the line layer, the method further comprises a following step:
forming a bit line isolation layer covering sidewalls of the diffusion barrier layer, sidewalls of the bit line layer, sidewalls and a top surface of the bit line cap layer, and the surface of the substrate isolation layer.

12. The method of forming the semiconductor structure according to claim 11, wherein the bit line isolation layer is made of a same material as the contact region isolation layer is made of.

13. The method of forming the semiconductor structure according to claim 11, wherein the step of forming the bit line isolation layer covering the sidewalls of the diffusion barrier layer, the sidewalls of the bit line layer, the sidewalls and the top surface of the bit line cap layer, and the surface of the substrate isolation layer further comprises a step of:
depositing a first dielectric material on the sidewalls of the diffusion barrier layer, the sidewalls of the bit line layer, the sidewalls and the top surface of the bit line cap layer, and the surface of the substrate isolation layer to form a first sub-bit line isolation layer;
depositing a second dielectric material on a surface of the first sub-bit line isolation layer to form a second sub-bit line isolation layer; and
depositing a third dielectric material on a surface of the second sub-bit line isolation layer to form a third sub-bit line isolation layer.

* * * * *